United States Patent
Lin et al.

(10) Patent No.: US 10,270,456 B1
(45) Date of Patent: Apr. 23, 2019

(54) APPARATUS AND METHOD FOR FREQUENCY TRIPLING

(71) Applicant: Realtek Semiconductor Corp., Hsinchu (TW)

(72) Inventors: Chia-Liang (Leon) Lin, Fremont, CA (US); Wenbo Xu, Campbell, CA (US); Fei Song, San Jose, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/859,827

(22) Filed: Jan. 2, 2018

(51) Int. Cl.
| | |
|---|---|
| *H04B 1/04* | (2006.01) |
| *G06F 1/04* | (2006.01) |
| *H04L 7/02* | (2006.01) |
| *H03K 5/15* | (2006.01) |
| *H03H 11/20* | (2006.01) |
| *H03K 5/13* | (2014.01) |
| *H03L 7/099* | (2006.01) |
| *H03L 7/087* | (2006.01) |
| *H03K 5/135* | (2006.01) |
| *H01L 27/092* | (2006.01) |
| *H04L 27/148* | (2006.01) |
| *H03L 7/18* | (2006.01) |
| *H03K 5/00* | (2006.01) |
| *H03L 7/04* | (2006.01) |

(52) U.S. Cl.
CPC ........ *H03L 7/0998* (2013.01); *H01L 27/0922* (2013.01); *H03K 5/00006* (2013.01); *H03K 5/135* (2013.01); *H03L 7/04* (2013.01); *H03L 7/087* (2013.01); *H03L 7/1806* (2013.01); *H04L 27/148* (2013.01)

(58) Field of Classification Search
CPC ......... H03L 7/0998; H03L 7/04; H03L 7/087; H03L 7/1806; H01L 27/0922; H03K 5/00006; H03K 5/135; H04L 27/148
USPC ........... 327/2–12, 141, 144–163; 331/15–17; 375/373–376
See application file for complete search history.

(56) References Cited

U.S. PATENT DOCUMENTS

| | | | |
|---|---|---|---|
| 7,912,167 B2* | 3/2011 | Saeki | H03L 7/0814 375/326 |
| 7,928,788 B2* | 4/2011 | Jiang | H03B 28/00 327/231 |
| 8,803,583 B2* | 8/2014 | Nedachi | H03K 5/135 327/251 |
| 2002/0172304 A1* | 11/2002 | Saze | G11C 7/1078 375/340 |
| 2003/0016762 A1* | 1/2003 | Martin | H04L 27/2007 375/308 |
| 2009/0179674 A1* | 7/2009 | Tamura | H03K 5/13 327/155 |
| 2011/0156757 A1* | 6/2011 | Hayashi | G01R 31/31726 327/3 |

(Continued)

*Primary Examiner* — Brandon S Cole
(74) *Attorney, Agent, or Firm* — McClure, Qualey & Rodack, LLP

(57) ABSTRACT

An apparatus includes a phase interpolator configured to receive a four-phase signal and output a six-phase signal, and a summing network configured to receive the six-phase signal and output a two-phase signal, wherein: a first phase, a third phase, and a fifth phase of the six-phase signal are summed to generate a second phase of the two-phase signal, while a second phase, a fourth phase, and a sixth phase of the six-phase signal are summed to generate a first phase of the two-phase signal.

15 Claims, 7 Drawing Sheets

(56) References Cited

U.S. PATENT DOCUMENTS

2015/0229290 A1* 8/2015 Suenaga ............... H03H 9/171
310/321
2017/0026050 A1* 1/2017 Weberg ................. H03L 7/081

* cited by examiner

APPARATUS AND METHOD FOR FREQUENCY TRIPLING

BACKGROUND OF THE INVENTION

Field of the Invention

The present invention generally relates to frequency multiplier circuits and more particularly to a frequency tripler circuit.

Description of Related Art

A depicted in FIG. 1, a prior art frequency tripler 100 receives an input signal $S_{in}$ and output an output signal $S_{out}$. Frequency tripler 100 comprises: a nonlinear circuit 101 configured to receive the input signal $S_{in}$ and output an intermediate signal $S_{int}$, and a bandpass filter 102 configured to receive the intermediate signal $S_{int}$ and output the output signal $S_{out}$. A third order nonlinearity of the nonlinear circuit 101 causes the intermediate signal $S_{int}$ to contain a rich third harmonic component. The bandpass filter 102 is configured to single out the third harmonic component in the intermediate signal $S_{int}$ so that the third harmonic component is a dominant spectral component in the output signal $S_{out}$. Consequently, a dominant frequency of the output signal $S_{out}$ is three times higher than a fundamental frequency of the input signal $S_{in}$, i.e. $f_{out}=3\ f_{in}$, where $f_{in}$ is the fundamental frequency of the input signal $S_{in}$ and $f_{out}$ is the dominant frequency of the output signal $S_{out}$.

The prior art frequency tripler 100 is not highly effective. Although the intermediate signal $S_{int}$ may contain a rich third harmonic content, in practice the fundamental component is still considerably stronger than the third harmonic component. Also, a practical implementation of the bandpass filter 102 can only have a moderate rejection of the fundamental component, unless a circuit of very high quality factor is used. Therefore, an appreciable level of the fundamental component usually remains appreciable in the output signal $S_{out}$.

What is desired is a frequency tripler that can greatly suppress the fundamental component without using a circuit of very high quality factor.

BRIEF SUMMARY OF THIS INVENTION

In an embodiment, an apparatus includes a phase interpolator configured to receive a four-phase signal and output a six-phase signal, and a summing network configured to receive the six-phase signal and output a two-phase signal, wherein: a first phase, a third phase, and a fifth phase of the six-phase signal are summed to generate a second phase of the two-phase signal, while a second phase, a fourth phase, and a sixth phase of the six-phase signal are summed to generate a first phase of the two-phase signal. In an embodiment, the phase interpolator includes six weighted sum circuits, wherein each of the six weighted sum circuits is configured to output a respective phase of the six-phase signal based on a respective weighted sum of a respective pair of phases of the four-phase signal. In an embodiment, the six weighted sum circuits include: a first weighted sum circuit configured to output the first phase of the six-phase signal in accordance with a weighted sum of a first phase and a second phase of the four-phase signal; a second weighted sum circuit configured to output the second phase of the six-phase signal in accordance with a weighted sum of the second phase and a third phase of the four-phase signal; a third weighted sum circuit configured to output the third phase of the six-phase signal in accordance with a weighted sum of the third phase and the second phase of the four-phase signal; a fourth weighted sum circuit configured to output the fourth phase of the six-phase signal in accordance with a weighted sum of the third phase and a fourth phase of the four-phase signal; a fifth weighted sum circuit configured to output the fifth phase of the six-phase signal in accordance with a weighted sum of the fourth phase and the first phase of the four-phase signal; and a sixth weighted sum circuit configured to output a sixth phase of the six-phase signal in accordance with a weighted sum of the first phase and the fourth phase of the four-phase signal. In an embodiment, the summing network comprises: a first differential pair configured to receive the first phase and the fourth phase of the six-phase signal and output a first current and a fourth current to a first output node and a second output node, respectively; a second differential pair configured to receive the third phase and the sixth phase of the six-phase signal and output a third current and a sixth current to the first output node and the second output node, respective; a third differential pair configured to receive the fifth phase and the second phase of the six-phase signal and output a fifth current and a second current to the first output node and the second node, respectively; a load network configured to provide a termination to the first output node and the second output node to establish the second phase and the first phase of the two-phase signal, respectively. In an embodiment, the load network is a resonator tuned to a third harmonic of the six-phase signal. In an embodiment, the apparatus further includes a quadrature generation network configured to receive an input clock and output the four-phase signal. In an embodiment, the quadrature generation network includes a divide-by-two network including a first data flip flop configured to receive the fourth phase of the four-phase signal and output the first phase and the third phase of the four-phase signal in accordance with an input clock, and a second data flip flop configured to receive the first phase of the four-phase signal and output the second phase and the fourth phase of the four-phase signal in accordance with an inversion of the input clock.

In an embodiment, a method comprises: receiving an input clock; generating a four-phase signal from the input clock using a quadrature generation network; generating a six-phase signal from the four-phase signal using interpolation; summing a first phase, a third phase, and a fifth phase of the six-phase signal to generate a second phase of a two-phase signal; summing a second phase, a fourth phase, and a sixth phase of the six-phase signal to generate a first phase of the two-phase signal; and filtering the two-phase signal to extract a third harmonic component. In an embodiment, the quadrature generation network includes a divide-by-two network including a first data flip flop configured to receive the fourth phase of the four-phase signal and output the first phase and the third phase of the four-phase signal in accordance with an input clock, and a second data flip flop configured to receive the first phase of the four-phase signal and output the second phase and the fourth phase of the four-phase signal in accordance with an inversion of the input clock. In an embodiment, each of the six phases of the six-phase signal is interpolated from a respective pair of phases of the four-phase signal. In an embodiment, the first phase of the six-phase signal is interpolated from a first phase and a second phase of the four-phase signal, the second phase of the six-phase signal is interpolated from the second phase and a third phase of the four-phase signal, the third phase of the six-phase signal is interpolated from the third phase and the second phase of the four-phase signal, the fourth phase of the six-phase signal is interpolated from the third phase and the fourth phase of the four-phase signal, the fifth phase of the six-phase signal is interpolated from the fourth phase and the first phase of the four-phase signal, and the sixth phase of the six-phase signal is interpolated from the first phase and the fourth phase of the four-phase signal. In an embodiment, a weighted sum is used to embody interpolation. In an embodiment, each of the six phases of the six-phase signal is generated by a respective weighted sum of a respective pair of phases of the four-phase signal.

DETAILED DESCRIPTION OF THIS INVENTION

The present invention relates to frequency tripler. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "circuit node," "power node," "ground node," "inverter," "voltage," "current," "current source," "CMOS (complementary metal oxide semiconductor)," "PMOS (P-channel metal oxide semiconductor) transistor," "NMOS (N-channel metal oxide semiconductor) transistor," "amplifier," "resistor," "capacitor," "inductor," "DC (direct current)," "differential pair," "phase," "clock," "signal," "frequency," "period," "load," "data flip flop," "delay lock loop," "phase lock loop," "duty cycle," and "quadrature phase." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

Throughout this disclosure, a DC node is a circuit node of a substantially stationary electric potential. "VDD" denotes a first DC node that is commonly referred to as a power node, while "VSS" denotes a second DC node that is commonly referred to as a ground node; both notations are widely used in literature and familiar to those of ordinary skill in the art.

Throughout this disclosure, a bus notation widely used in prior art is used. For instance, A[3:0] denotes a bus of width four and includes four constituent signals A[0], A[1], A[2], and A[3].

Throughout this disclosure, a clock is a signal that cyclically toggles back and forth between a high level and a low level.

Figure 2:
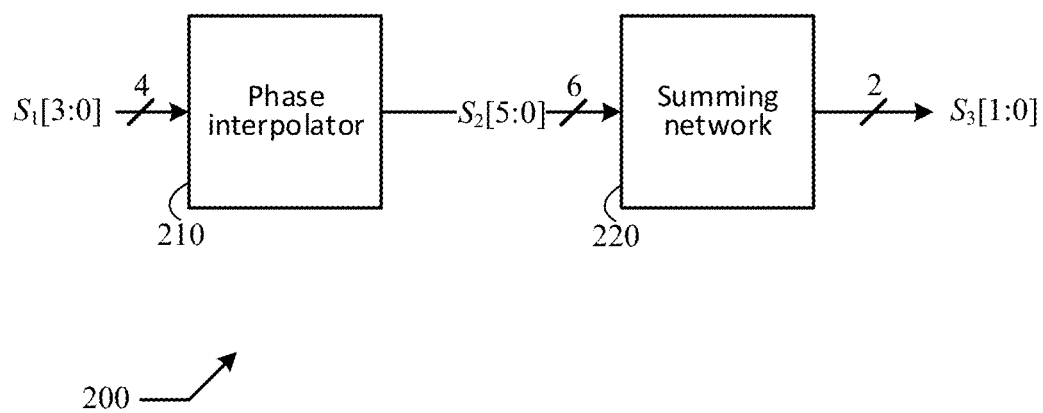
FIG. 2 shows a functional block diagram of a frequency tripler in accordance with an embodiment of the present invention.
Figure 3:
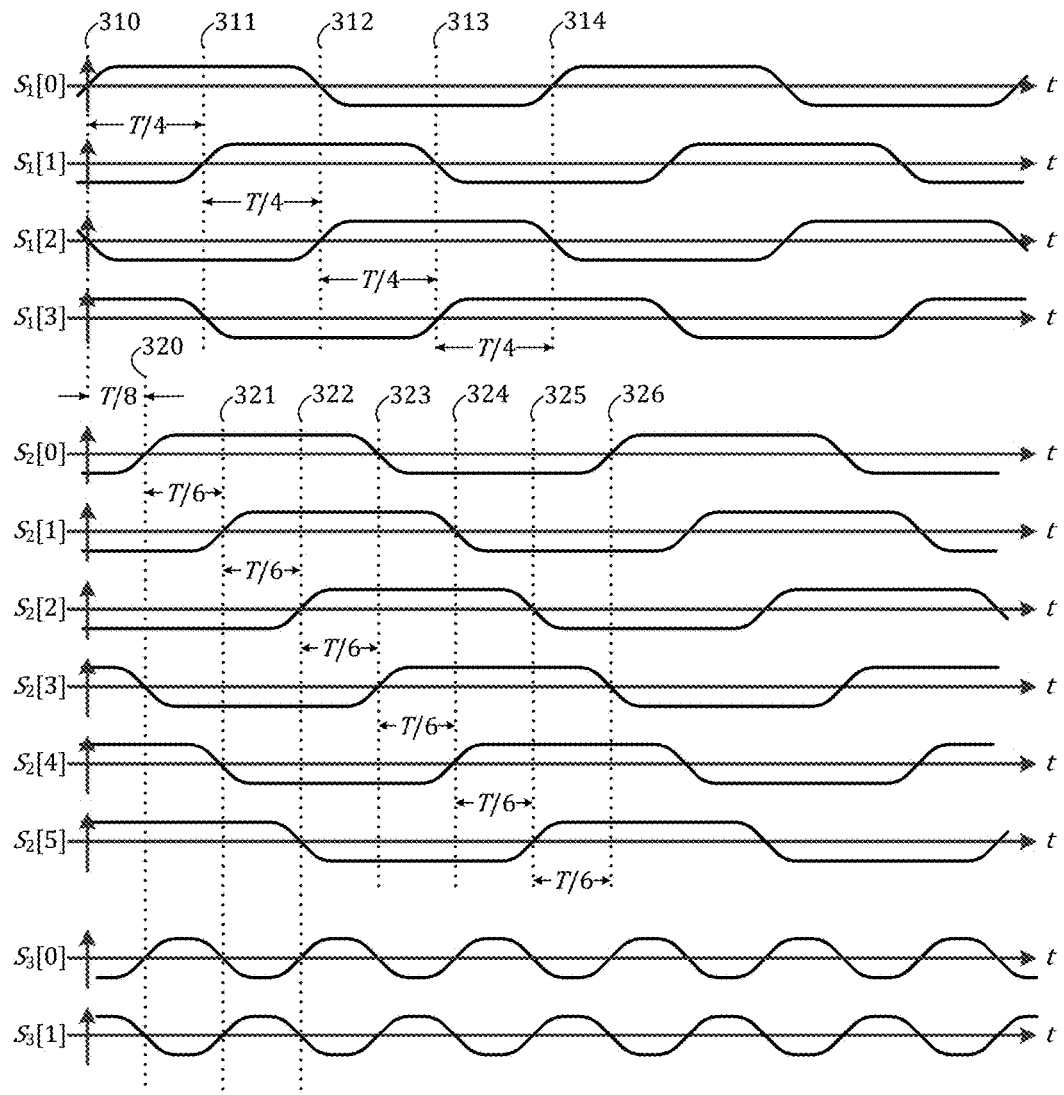
FIG. 3 shows an illustrative timing diagram for the frequency tripler of FIG. 2.

A functional block diagram of a frequency tripler 200 in accordance with an embodiment of the present invention is depicted in FIG. 2. Frequency tripler 200 includes: a phase interpolator 210 configured to receive a four-phase signal $S_1[3:0]$ and output a six-phase signal $S_2[5:0]$, and a summing network 220 configured to receive the six-phase signal $S_2[5:0]$ and output a two-phase signal $S_3[1:0]$. An illustrative timing diagram of $S_1[3:0]$, $S_2[5:0]$, and $S_3[1:0]$ are depicted in FIG. 3. As shown, $S_1[0]$, $S_1[1]$, $S_1[2]$, $S_1[3]$, $S_2[0]$, $S_2[1]$, $S_2[2]$, $S_2[3]$, $S_2[4]$, and $S_2[5]$ are all periodic with a period T and evenly separated in time. For each signal in FIG. 3, the horizontal axis is a time variable denoted by "t," and the vertical axis is a voltage of the signal. $S_1[0]$ ($S_1[1]$, $S_1[2]$, $S_1[3]$) is said to be a first (second, third, fourth) phase of the four-phase signal $S_1[3:0]$, and has a rising edge at time instant 310 (311, 312, 313). Time instant 311 (312, 313, 314) trails time instant 310 (311, 312, 313) by T/4. Moreover, $S_2[0]$ ($S_2[1]$, $S_2[2]$, $S_2[3]$, $S_2[4]$, $S_2[5]$) is said to be a first (second, third, fourth, fifth, sixth) phase of the six-phase signal $S_2[5:0]$, and has a rising edge at time instant 320 (321, 322, 323, 324, 325). Time instant 321 (322, 323, 324, 325, 326) trails time instant 320 (321, 322, 323, 324, 325) by T/8. Here, $S_2[0]$ (which is the first phase of $S_2[5:0]$) trails $S_1[0]$ (which is the first phase of $S_1[3:0]$) in timing by approximately T/8. Furthermore, $S_3[0]$, and $S_3[1]$ are both periodic with a period T/3 and evenly separated in time. $S_3[0]$ ($S_3[1]$) is said to be a first (second) phase of the output signal $S_3[1:0]$, and has a rising edge at timing instant 320 (321). Time instant 321 (322) trails time instant 320 (323) by T/6, which is one half of the period of the output signal $S_3[1:0]$.

Mathematically, $S_1[3:0]$ can be approximated by the following equation:

$$S_1[i] = V_1^{(1)}\sin\left(\frac{2\pi t}{T} - \frac{i\pi}{2}\right) + V_1^{(3)}\sin\left(\frac{6\pi t}{T} - \frac{3i\pi}{2}\right) + V_{M1}, \quad (1)$$

for $i = 0, 1, 2, 3$.

Here, $V_1^{(1)}$ and $V_1^{(3)}$ are amplitudes of the fundamental component and the third harmonic component of $S_1[3:0]$, respectively, and $V_{M1}$ is a first constant. Based on equation (1), $S_1[0]$, $S_1[1]$, $S_1[2]$, and $S_1[3]$ can be said to be representative of a 0-degree, 90-degree, 180-degree, and 270-degree phase, respectively, as far as the fundamental component is concerned. Although $S_1[3:0]$ also contain additional harmonic components, only the fundamental component and the third harmonic component are considered here since they are the top two components among all.

$S_2[5:0]$ can be approximated by the following equation:

$$S_2[i] = V_2^{(1)}\sin\left(\frac{2\pi t}{T} - \frac{i\pi}{3} - \frac{\pi}{4}\right) + V_2^{(3)}\sin\left(\frac{6\pi t}{T} - i\pi - \frac{3\pi}{4}\right) + V_{M2}, \quad (2)$$

for $i = 0, 1, 2, 3, 4, 5$.

Here, $V_2^{(1)}$ and $V_2^{(3)}$ are amplitudes of the fundamental component and the third harmonic component of $S_2[5:0]$, respectively, and $V_{M2}$ is a second constant. Based on equation (2), $S_2[0]$, $S_2[1]$, $S_2[2]$, $S_2[3]$, $S_2[4]$, and $S_2[5]$ can be said to be of a 45-degree, 105-degree, 165-degree, 225-degree, 285-degree, and 345-degree phase, respectively, as far as the fundamental component is concerned.

Figure 4:
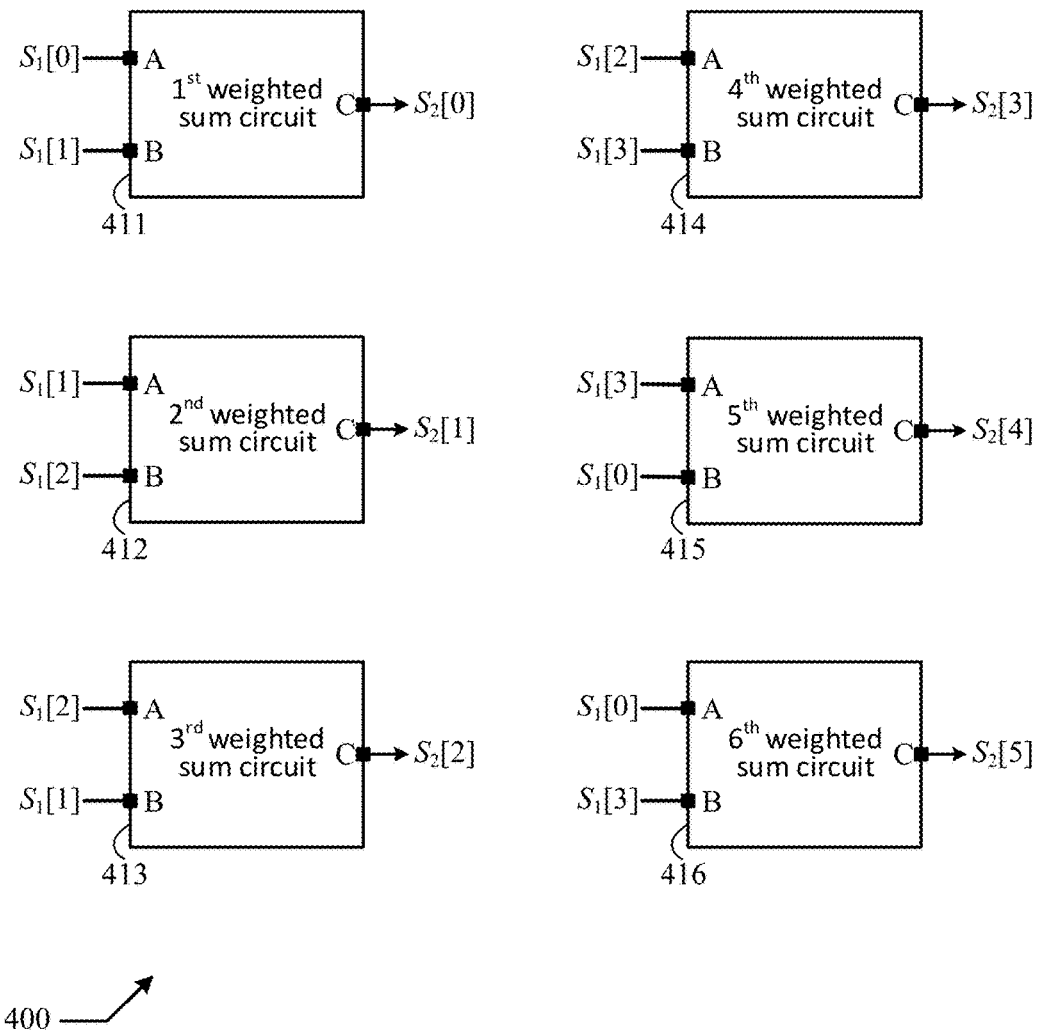
FIG. 4 shows a schematic diagram of an embodiment of a four-phase to six-phase interpolator.

Phase interpolator 210 is configured to generate the six-phase signal $S_2[5:0]$ from the four-phase signal $S_1[3:0]$ by way of interpolation. A schematic diagram of a phase interpolator 400 suitable for embodying phase interpolator 210 in accordance with an embodiment of the present invention is depicted in FIG. 4. As shown, phase interpolator 400 includes: a $1^{st}$ ($2^{nd}$, $3^{rd}$, $4^{th}$, $5^{th}$, $6^{th}$) weighted sum circuit 411 (412, 413, 414, 415, 416); each of the six weighted sum circuits 411~416 has a first input pin labeled as "A,", a second input pin labeled as "B," and an output pin labeled as "C." The $1^{st}$ ($2^{nd}$, $3^{rd}$, $4^{th}$, $5^{th}$, $6^{th}$) weighted sum circuit 411 (412, 413, 414, 415, 416) receives $S_1[0]$ ($S_1[1]$, $S_1[2]$, $S_1[2]$, $S_1[3]$, $S_1[0]$) at its first input pin "A," receives $S_1[1]$ ($S_1[2]$, $S_1[1]$, $S_1[3]$, $S_1[0]$, $S_1[3]$) at its second input pin "B," and outputs $S_2[0]$ ($S_2[1]$, $S_2[2]$, $S_2[3]$, $S_2[4]$, $S_2[5]$) at its output pin "C." Each of the six weighted sum circuits 411~416 performs a function that can be approximately modeled by the following equation $$V_C = W_A V_A W_B V_B \quad (3)$$

Here, $V_A$ is a voltage at the first input pin "A," $V_B$ is a voltage at the second input pin "B," $V_C$ is a voltage at the output pin "C," $W_A$ is a weight associated with $V_A$, and $W_B$ is a weight associated with $V_B$. When $V_A$ and $V_B$ are summed in a weighted manner to generate $V_C$, a phase of $V_C$ is approximately a weighted sum of a phase of $V_A$ and a phase of $V_B$.

Figure 5:
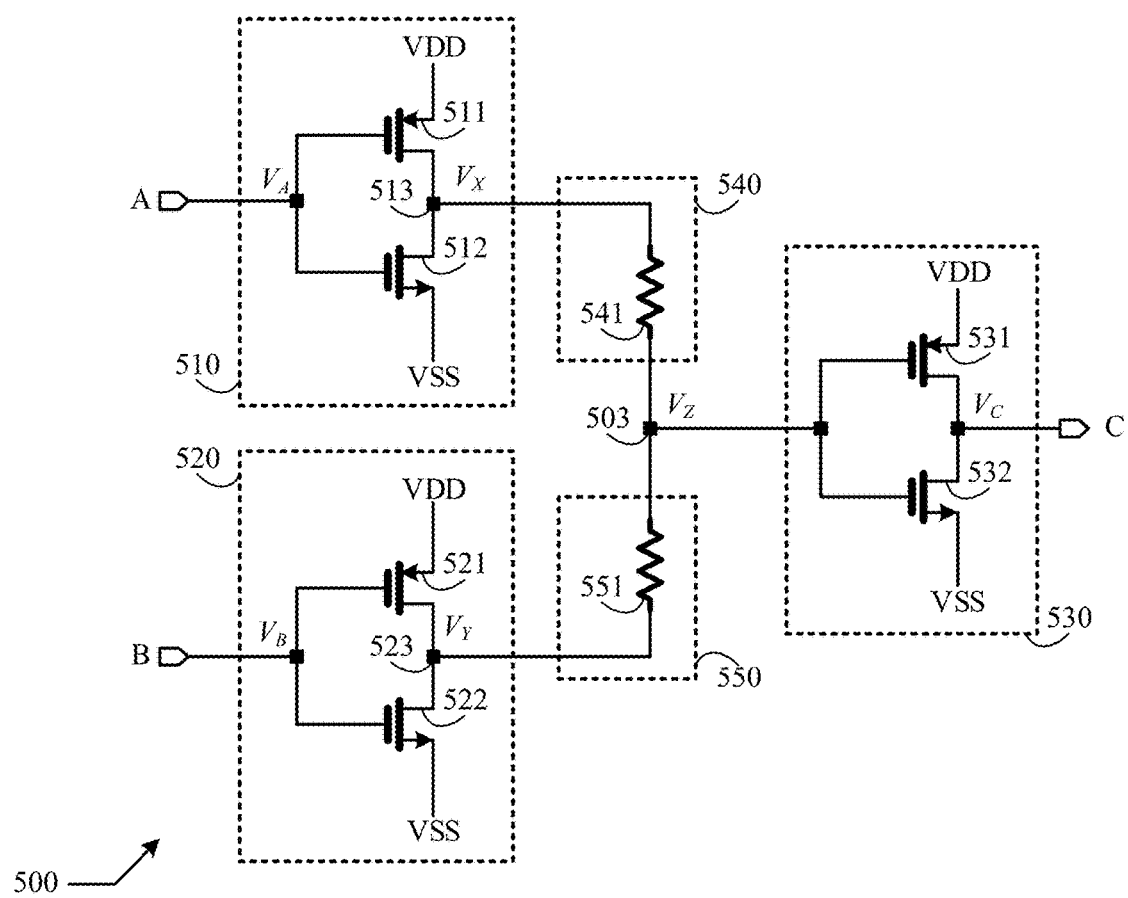
FIG. 5 shows a schematic diagram of an embodiment of a weighted sum circuit.

In an embodiment, the values of $W_A$ and $W_B$ for each of the six weighted sum circuits 411~416, along with the respective signals and phases at pins "A," "B", and "C" are tabulated in the following table:

from the second input pin "B" and output a second internal voltage $V_Y$ at a second internal node 523, a first coupling network 540 configured to couple the first internal node 513 to a third internal node 503, a second coupling network 550 configured to couple the second internal node 523 to the third internal node 503, and a third amplifier 530 configured to receive a summed voltage $V_Z$ at the third internal node 503 and output the voltage $V_C$ at the output pin "C." In this particular embodiment shown in FIG. 5, the first amplifier 510 is a CMOS inverter including a first PMOS transistor 511 and a first NMOS transistor 512, the second amplifier 520 is a CMOS inverter including a second PMOS transistor 521 and a second NMOS transistor 522, the first coupling network 540 includes a first resistor 541, the second coupling network 550 includes a second resistor 551, and the third amplifier 530 is a CMOS inverter including a third PMOS transistor 531 and a third NMOS transistor 532. The voltage $V_A$ and the voltage $V_B$ are summed in weighted manner, wherein the relative strengths between the first amplifier 510 and the second amplifier 520 determine the relative weights. Let the width and length of the first (second) PMOS transistor 511 (521) be $W_{P1}$ ($W_{P2}$) and $L_{P1}$ ($L_{P2}$), respectively. Let the width and length of the first (second) NMOS transistor 512 (522) be $W_{N1}$ ($W_{N2}$) and $L_{N1}$ ($L_{N2}$), respectively. Let $W_{P1}/L_{P1} = \alpha W_{N1}/L_{N1}$ and $W_{P2}/L_{P2} = \alpha W_{N2}/L_{N2}$, where $\alpha$ is a design parameter. Then, $W_A$ (which is the weight associated with $V_A$) is proportional to $W_{N1}/L_{N1}$, while $W_B$ (which is the weight associated with $V_B$) is proportional to $W_{N2}/L_{N2}$. Now refer to Table 1. For the $1^{st}$ weighted sum circuit 411 and the $4^{th}$ weighted sum circuit 414, $W_A$ and $W_B$ are the same (both equal to ½); in this case, $W_{N1}/L_{N1}$ must be approximately equal to $W_{N2}/L_{N2}$. For the $2^{nd}$ weighted sum circuit 412, the $3^{rd}$ weighted sum circuit 413, the fifth weighted sum circuit 415, and the $6^{th}$ weighted sum circuit 416, $W_A$ is five times greater than $W_B$; in this case, $W_{N1}/L_{N1}$ must be approximately five times greater than $W_{N2}/L_{N2}$. By way of example but not limitation, in an embodiment, the frequency tripler 200 is fabricated by using a 28 nm CMOS process, a fundamental frequency of $S_1[3:0]$ is 4 GHz, and the values of $W_{P1}$, $L_{P1}$, $W_{N1}$, $L_{N1}$, $W_{P2}$, $L_{P2}$, $W_{N2}$, and $L_{N2}$ for the six weighted sum circuits 411~416 are tabulated in the following table:

TABLE 1

| weighted sum circuit | $V_A$ | phase of $V_A$ | $W_A$ | $V_B$ | phase of $V_B$ | $W_B$ | $V_C$ | phase of $V_C$ |
|---|---|---|---|---|---|---|---|---|
| $1^{st}$ (411) | $S_1[0]$ | 0 | ½ | $S_1[1]$ | 90 | ½ | $S_2[0]$ | $0 \times \frac{1}{2} + 90 \times \frac{1}{2} = 45$ |
| $2^{nd}$ (412) | $S_1[1]$ | 90 | ⅚ | $S_1[2]$ | 180 | ⅙ | $S_2[1]$ | $90 \times \frac{5}{6} + 180 \times \frac{1}{6} = 105$ |
| $3^{rd}$ (413) | $S_1[2]$ | 180 | ⅚ | $S_1[1]$ | 90 | ⅙ | $S_2[2]$ | $180 \times \frac{5}{6} + 90 \times \frac{1}{6} = 165$ |
| $4^{th}$ (414) | $S_1[2]$ | 180 | ½ | $S_1[3]$ | 270 | ½ | $S_2[3]$ | $180 \times \frac{1}{2} + 270 \times \frac{1}{2} = 225$ |
| $5^{th}$ (415) | $S_1[3]$ | 270 | ⅚ | $S_1[0]$ | 360 | ⅙ | $S_2[4]$ | $270 \times \frac{5}{6} + 360 \times \frac{1}{6} = 285$ |
| $6^{th}$ (416) | $S_1[0]$ | 360 | ⅚ | $S_1[3]$ | 270 | ⅙ | $S_2[5]$ | $360 \times \frac{5}{6} + 270 \times \frac{1}{6} = 345$ |

Note that 360-degree is the same as 0-degree.

A schematic diagram of a weighted sum circuit 500 that can be used to embody the six weighted sum circuits 411~416 of FIG. 4 is depicted in FIG. 5. Weighted sum circuit 500 includes a first amplifier 510 configured to receive the voltage $V_A$ from the first input pin "A" and output a first internal voltage $V_X$ at a first internal node 513, a second amplifier 520 configured to receive the voltage $V_B$

TABLE 2

| weighted sum circuit | $W_{P1}$ | $L_{P1}$ | $W_{N1}$ | $L_{N1}$ | $W_{P2}$ | $L_{P2}$ | $W_{N2}$ | $L_{N2}$ |
|---|---|---|---|---|---|---|---|---|
| $1^{st}$ (411) | 1.8 μm | 30 nm | 1.5 μm | 30 nm | 1.8 μm | 30 nm | 1.5 μm | 30 nm |
| $2^{nd}$ (412) | 3 μm | 30 nm | 2.5 μm | 30 nm | 0.6 μm | 30 nm | 0.5 μm | 30 nm |
| $3^{rd}$ (413) | 3 μm | 30 nm | 2.5 μm | 30 nm | 0.6 μm | 30 nm | 0.5 μm | 30 nm |
| $4^{th}$ (414) | 1.8 μm | 30 nm | 1.5 μm | 30 nm | 1.8 μm | 30 nm | 1.5 μm | 30 nm |
| $5^{th}$ (415) | 3 μm | 30 nm | 2.5 μm | 30 nm | 0.6 μm | 30 nm | 0.5 μm | 30 nm |
| $6^{th}$ (416) | 3 μm | 30 nm | 2.5 μm | 30 nm | 0.6 μm | 30 nm | 0.5 μm | 30 nm |

The first coupling network 540 and the second coupling network 550 provide a means for summing $V_X$ and $V_Y$ into $V_Z$. In an embodiment, the first coupling network 540 and the second coupling network 550 are also used to fulfill a weighted sum function. Let the resistance values of the first resistor 541 and the second resistor 551 be $R_A$ and $R_B$, respectively. In an embodiment, $R_A/R_B$ is equal to $W_B/W_A$. For the $1^{st}$ weighted sum circuit 411 and the $4^{th}$ weighted sum circuit 414, $W_A$ and $W_B$ are the same (since both are equal to ½); in this case, $R_A/R_B$ must be approximately 1. For the $2^{nd}$ weighted sum circuit 412, the $3^{rd}$ weighted sum circuit 413, the $5^{th}$ weighted sum circuit 415, and the $6^{th}$ weighted sum circuit 416, $W_A$ (which is ⅚) is five times greater than $W_B$ (which is ⅙); in this case, $R_A/R_B$ must be approximately ⅕. By way of example but not limitation, in an embodiment, the values of $R_A$ and $R_B$ for the six weighted sum circuits 411~416 are tabulated in the following table:

TABLE 3

| weighted sum circuit | $R_A$ | $R_B$ |
|---|---|---|
| $1^{st}$ (411) | 300-Ohm | 300-Ohm |
| $2^{nd}$ (412) | 100-Ohm | 500-Ohm |
| $3^{rd}$ (413) | 100-Ohm | 500-Ohm |
| $4^{th}$ (414) | 300-Ohm | 300-Ohm |
| $5^{th}$ (415) | 100-Ohm | 500-Ohm |
| $6^{th}$ (416) | 100-Ohm | 500-Ohm |

In an alternative embodiment, the first coupling network 540 and the second coupling network 550 are simply used to fulfill a coupling function without fulfilling a weighted sum function. In this alternative embodiment, the two resistors 541 and 551 are replaced by two short circuits, i.e. $R_A$ and $R_B$ are both approximately zero Ohm, and the weighted sum function is simply fulfilled by the relative strengths of the two amplifiers 510 and 520, as explained earlier. The third amplifier 530 serves as an inverting buffer configured to receive the summed voltage $V_Z$ and output the voltage $V_C$ at the output pin "C" in accordance with a driving capability needed for a subsequent circuit (which is the summing network 220 of FIG. 2). By way of example but not limitation, in an embodiment, the width and length of the third PMOS transistor 531 are 3.6 μm and 30 nm, respectively, while the width and length of the third NMOS transistor 532 are 3 μm and 30 nm, respectively, for all the six weighted sum circuits 411~416 of FIG. 4.

Referring again to FIG. 2, in an embodiment, the summing network 220 is configured to fulfill a summing function that can be mathematically modeled as:

$$S_3[1]=G \cdot (S_2[0]+S_2[2]+S_2[4]) \quad (4)$$

$$S_3[0]=G \cdot (S_2[1]+S_2[3]+S_2[5]) \quad (5)$$

Figure 6:
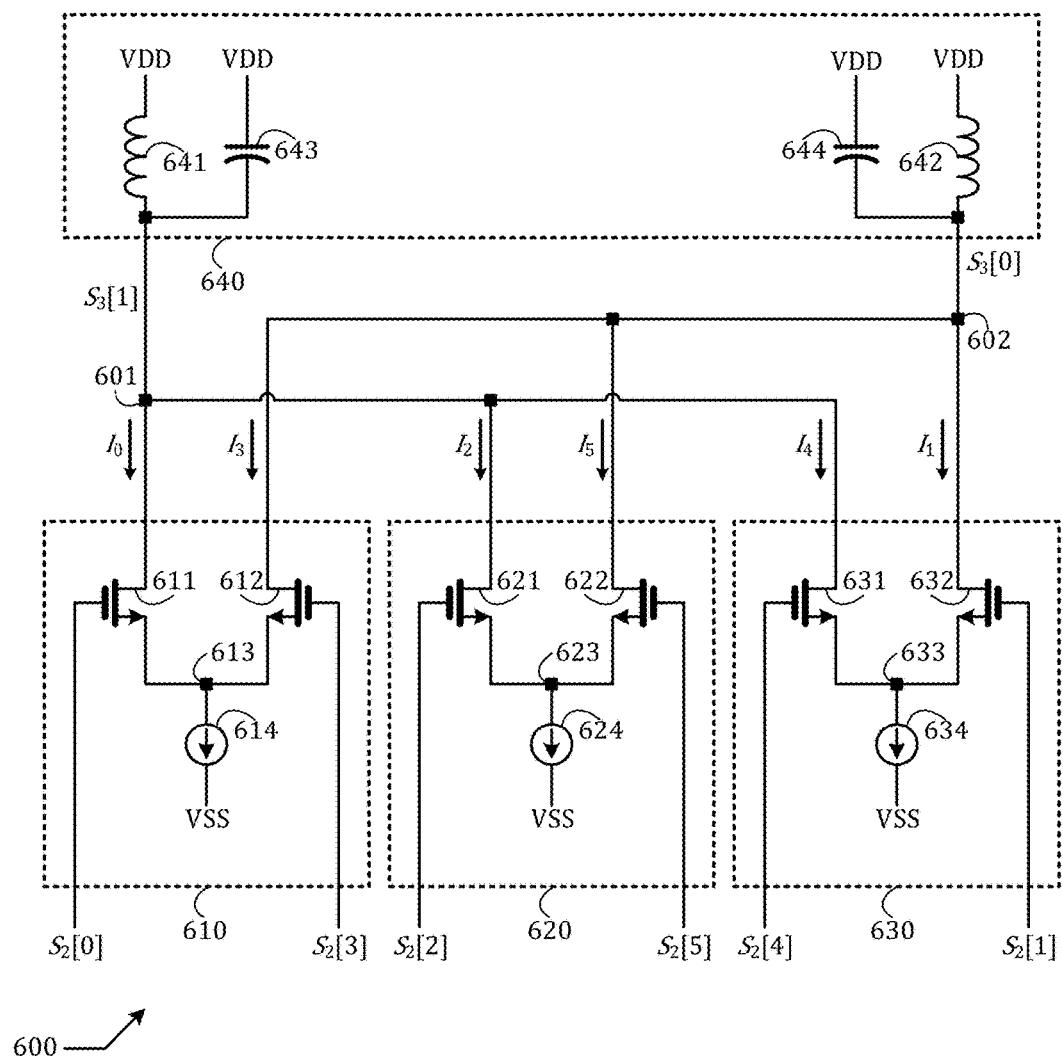
FIG. 6 shows a schematic diagram of an embodiment of a summing network.

Here, G is a gain factor. A summing network 600 suitable for embodying the summing network 220 in accordance with equations (4) and (5) is depicted in FIG. 6. Summing network 600 includes: a first differential pair 610 configured to receive $S_2[0]$ and $S_2[3]$ and output a first current pair $I_0$ and $I_3$ to a first output node 601 and a second output node 602, respectively; a second differential pair 620 configured to receive $S_2[2]$ and $S_2[5]$ and output a second current pair $I_2$ and $I_5$ to the first output node 601 and the second output node 602, respectively; a third differential pair 630 configured to receive $S_2[4]$ and $S_2[1]$ and output a third current pair $I_4$ and $I_1$ to the first output node 601 and the second output node 602, respectively; and a load network 640 configured to provide a load to the first output node 601 and the second output node 602. The first (second, third) differential pair 610 (620, 630) includes: a first (second, third) current source 614 (624, 634) and a first (second, third) pair of NMOS transistors 611 (621, 631) and 612 (622, 623) configured to receive $S_2[0]$ ($S_2[2]$, $S_2[4]$) and $S_2[3]$ ($S_2[5]$, $S_2[1]$) and output $I_0$ ($I_2$, $I_4$) and $I_3$ ($I_5$, $I_1$), respectively. Differential pairs such as 610, 620, and 630 are well known to those of ordinary skill in the art and thus not explained in detail here. The outputs from the three differential pairs 610, 620, and 630 are summed at the first output node 601 and the second output node 602, resulting in $S_3[1]$ and $S_3[0]$, respectively.

In this embodiment, the load network 640 includes a first inductor 641, a second inductor 642, a first capacitor 643, and a second capacitor 644, wherein the first inductor 641 and the first capacitor 643 forms a first resonant tank to provide a termination at the first output node 601, while the second inductor 642 and the second capacitor 644 forms a second resonant tank to provide a termination at the second output node 602. By way of example but not limitation: a fundamental frequency of $S_2[5:0]$ is 4 GHz; the width and the length are 3 μm and 30 nm, respectively, for each of the six NMOS transistors 611, 612, 621, 622, 631, and 632; the current is 400 μA for each of the three current sources 614, 624, and 634; the inductance is 1 nH for each of the two inductors 641 and 642; and the capacitance is 175 fF for each of the two capacitors 643 and 644. Note that both the first resonant tank and the second resonant tank are tuned to the third harmonic frequency (12 GHz, which is three times higher than the fundamental frequency of $S_2[5:0]$) to make the third harmonic components dominant in $S_3[1:0]$.

Figure 1:
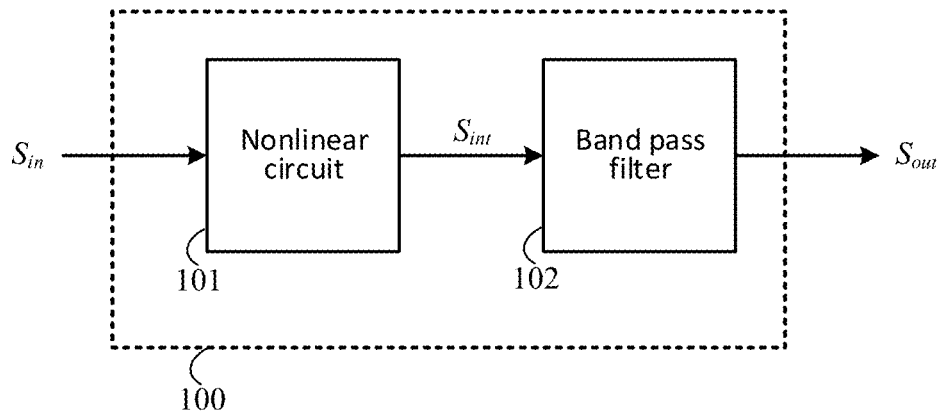
FIG. 1 shows a schematic diagram of a prior art frequency tripler

Frequency tripler 200 of FIG. 2 is superior to the prior art frequency tripler 100 of FIG. 1, since the fundamental component is canceled when the summing network 220 carries out the summing function. The fundamental components of $S_2[0]$, $S_2[2]$, and $S_2[4]$ are three phasors that are of the same amplitude but 120 degrees (that is, $2\pi/3$) apart from one another in phase. Likewise, the fundamental components of $S_2[1]$, $S_2[3]$, and $S_2[5]$ are three phasors that are of the same amplitude but 120 degrees apart from one another in phase. It is a mathematical identity that $e^{j\theta}+e^{j(\theta+2\pi/3)}+e^{j(\theta+4\pi/3)}=0$ for any phase $\theta$. Therefore, theoretically the fundamental components of $S_3[0]$ (which is a sum of $S_2[0]$, $S_2[2]$, and $S_2[4]$) and $S_3[1]$ (which is a sum of $S_2[1]$, $S_2[3]$, and $S_2[5]$) should be zero. On the other hand, the third harmonic components of $S_2[0]$, $S_2[2]$, and $S_2[4]$ all in phase and thus are enhanced when summed, so are the third harmonic components of $S_2[1]$, $S_2[3]$, and $S_2[5]$. Consequently, $S_3[0]$ and $S_3[1]$ have strong third harmonics components but theoretically zero fundamental components.

Figure 7:
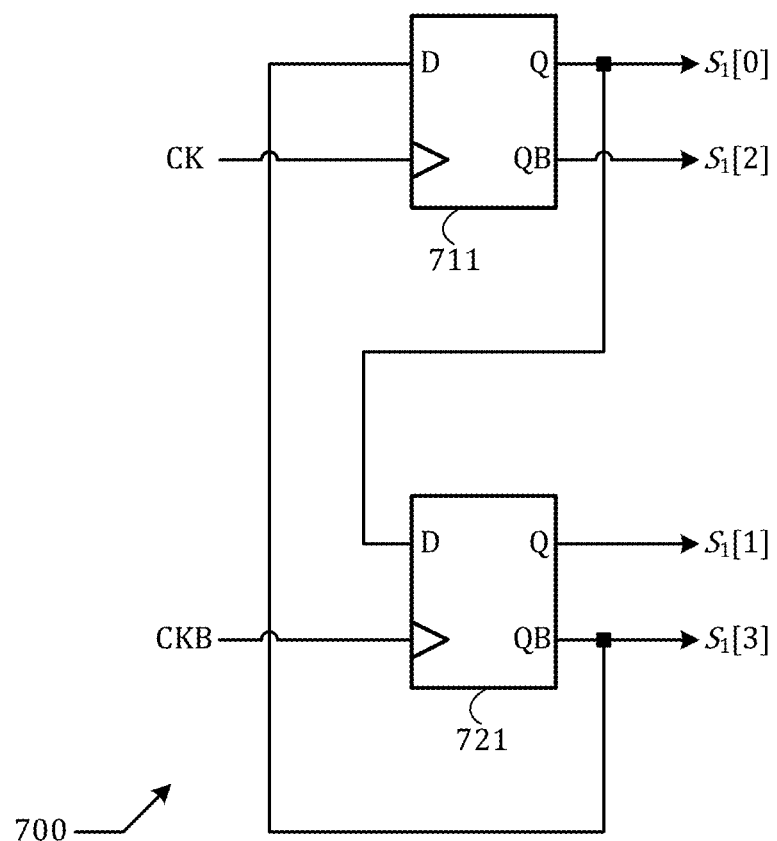
FIG. 7 shows a schematic diagram of a quadrature generation network.

In an embodiment, the four-phase signal $S_1[3:0]$ is generated from an input clock by using a quadrature generation network. An exemplary embodiment of using a quadrature generation network 700 to generate the four-phase signal $S_1[3:0]$ is depicted in FIG. 7. The quadrature generation network 700 is a divide-by-two network including a first DFF (data flip flop) 711 configured to receive $S_1[3]$ and output $S_1[0]$ and $S_1[2]$ in accordance with a rising edge of an input clock CK, and a second DFF 721 configured to receive $S_1[0]$ and output $S_1[1]$ and $S_1[3]$ in accordance with a rising edge of a complementary clock CKB, which is an inversion of the input clock CK. Each of DFF 711 and DFF 721 has an input pin labeled as "D," an output pin labeled as "Q," a complementary output pin labeled as "QB," and a clock pin labeled by a wedge symbol. Quadrature generation network 700 is widely used and well understood by those of ordinary skill in the art and thus not described in detail here. Note that in this embodiment a fundamental frequency of the input clock CK is twice as high as the fundamental frequency of $S_1[3:0]$. In an embodiment, CKB is generated from CK by using an inverter (not shown in the figure but obvious to those of ordinary skill in the art). Note that to have an accurate quadrature generation, both CK and CKB must have a duty cycle close to 50%.

In another embodiment, the four-phase signal $S_1[3:0]$ is generated from an input clock by using a delay lock loop. Using a delay lock loop to generate a four-phase signal from an input clock is well known in prior art and thus not described in detail here. In this embodiment, a fundamental frequency of the input clock is the same as the fundamental frequency of $S_1[3:0]$, and the delay lock loop serves as a quadrature generation network.

In yet another embodiment, the four-phase signal $S_1[3:0]$ is generated from an input clock by using a ring oscillator of an even number of stages controlled in a closed-loop manner by a phase lock loop. Using a ring oscillator of an even number of stages (e.g., 4-stage ring oscillator) controlled in a closed-loop manner to generate a four-phase signal from an input clock is well known in prior art and thus not described in detail here. In this embodiment, the fundamental frequency of $S_1[3:0]$ is higher than a fundamental frequency of the input clock by a multiplication factor of the phase lock loop, and the ring oscillator in the phase lock loop serves as a quadrature generation network.

Figure 8:
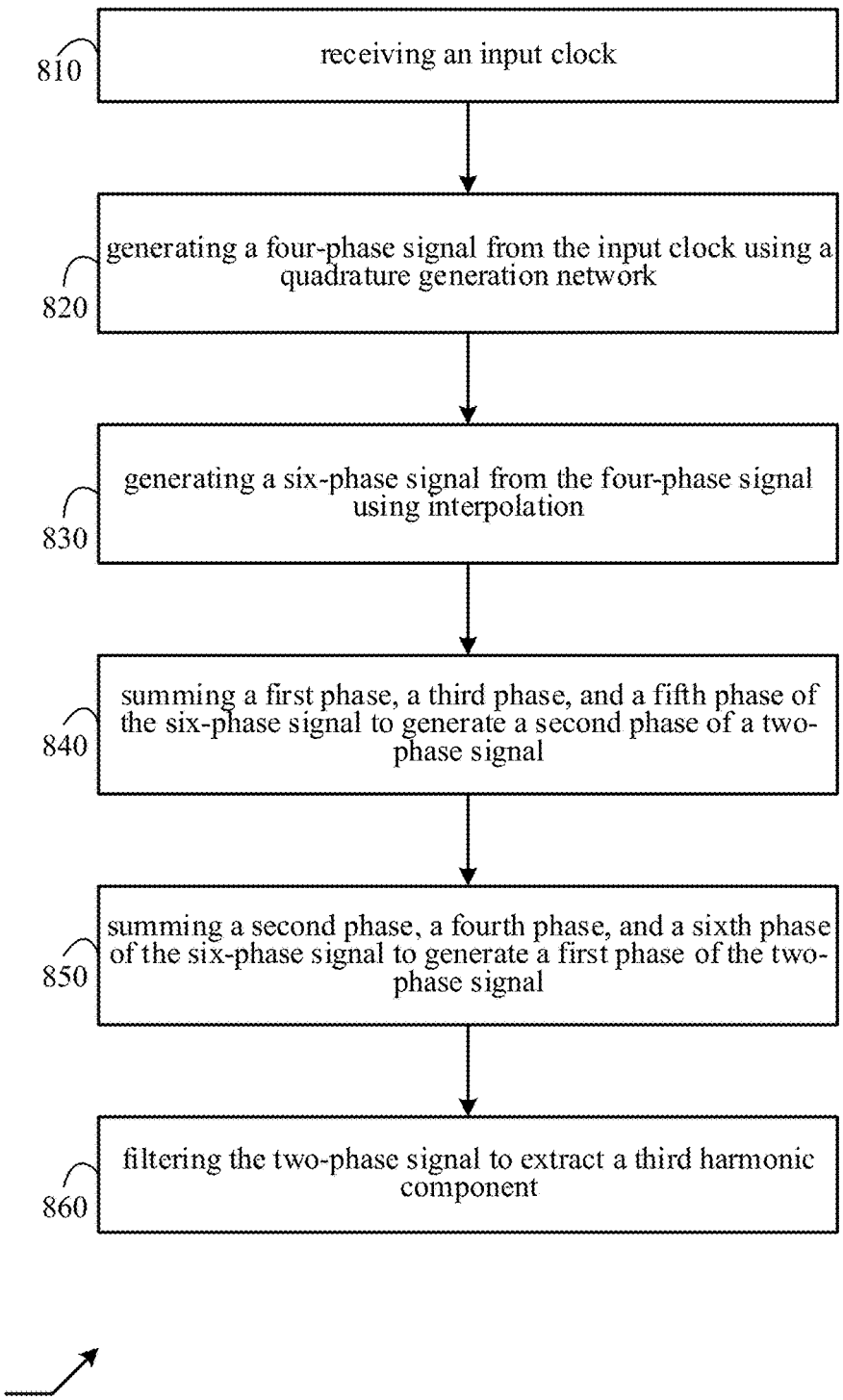
FIG. 8 shows a flow diagram of a method in accordance with in an embodiment of the present invention.

In an embodiment depicted in a flow diagram shown in FIG. 8, a method comprises: receiving an input clock (step 810); generating a four-phase signal from the input clock using a quadrature generation network (step 820); generating a six-phase signal from the four-phase signal using interpolation (step 830); summing a first phase, a third phase, and a fifth phase of the six-phase signal to generate a second phase of a two-phase signal (step 840); summing a second phase, a fourth phase, and a sixth phase of the six-phase signal to generate a first phase of a two-phase signal; and filtering the two-phase signal to extract a third harmonic component.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An apparatus comprising:
a phase interpolator configured to receive a four-phase signal and output a six-phase signal, and
a summing network configured to receive the six-phase signal and output a two-phase signal,
wherein: a first phase, a third phase, and a fifth phase of the six-phase signal are summed to generate a second phase of the two-phase signal, while a second phase, a fourth phase, and a sixth phase of the six-phase signal are summed to generate a first phase of the two-phase signal.

2. The apparatus of claim 1, wherein the phase interpolator includes six weighted sum circuits, wherein each of the six weighted sum circuits is configured to output a respective phase of the six-phase signal based on a respective weighted sum of a respective pair of phases of the four-phase signal.

3. The apparatus of claim 2, wherein the six weighted sum circuits include:
a first weighted sum circuit configured to output the first phase of the six-phase signal in accordance with a weighted sum of a first phase and a second phase of the four-phase signal;
a second weighted sum circuit configured to output the second phase of the six-phase signal in accordance with a weighted sum of the second phase and a third phase of the four-phase signal;
a third weighted sum circuit configured to output the third phase of the six-phase signal in accordance with a weighted sum of the third phase and the second phase of the four-phase signal;
a fourth weighted sum circuit configured to output the fourth phase of the six-phase signal in accordance with a weighted sum of the third phase and a fourth phase of the four-phase signal;
a fifth weighted sum circuit configured to output the fifth phase of the six-phase signal in accordance with a weighted sum of the fourth phase and the first phase of the four-phase signal; and
a sixth weighted sum circuit configured to output a sixth phase of the six-phase signal in accordance with a weighted sum of the first phase and the fourth phase of the four-phase signal.

4. The apparatus of claim 1, wherein the summing network includes:
a first differential pair configured to receive the first phase and the fourth phase of the six-phase signal and output a first current and a fourth current to a first output node and a second output node, respectively;
a second differential pair configured to receive the third phase and the sixth phase of the six-phase signal and output a third current and a sixth current to the first output node and the second output node, respective;
a third differential pair configured to receive the fifth phase and the second phase of the six-phase signal and output a fifth current and a second current to the first output node and the second node, respectively;
a load network configured to provide a termination to the first output node and the second output node to establish the second phase and the first phase of the two-phase signal, respectively.

5. The apparatus of claim 4, wherein the load network is a resonator tuned to a third harmonic of the six-phase signal.

6. The apparatus of claim 1 further including a quadrature generation network configured to receive an input clock and output the four-phase signal.

7. The apparatus of claim 6, wherein the quadrature generation network includes:
   a first divide-by-two circuit configured to receive the input clock and output a first phase and a third phase of the four-phase signal, and
   a second divide-by-two circuit configured to receive an inversion of the input clock and output a second phase and a fourth phase of the four-phase signal.

8. The apparatus of claim 7, wherein the first divide-by-two circuit includes a first data flip flop, while the second divide-by-two circuit includes a second data flip flop.

9. A method for frequency tripling comprising:
   receiving an input clock;
   generating a four-phase signal from the input clock using a quadrature generation network;
   generating a six-phase signal from the four-phase signal using interpolation;
   summing a first phase, a third phase, and a fifth phase of the six-phase signal to generate a second phase of a two-phase signal;
   summing a second phase, a fourth phase, and a sixth phase of the six-phase signal to generate a first phase of the two-phase signal; and
   filtering the two-phase signal to extract a third harmonic component,
   wherein the extracted third harmonic component is three times the frequency of the input clock.

10. The method of claim 9, wherein the quadrature generation network includes a first divide-by-two circuit configured to receive the input clock and output a first phase and a third phase of the four-phase signal, and a second divide-by-two circuit configured to receive an inversion of the input clock and output a second phase and a fourth phase of the four-phase signal.

11. The method of claim 10, wherein the first divide-by-two circuit includes a first data flip flop, while the second divide-by-two circuit includes a second data flip flop.

12. The method of claim 9, wherein each of the six phases of the six-phase signal is interpolated from a respective pair of phases of the four-phase signal.

13. The method of claim 12, wherein the first phase of the six-phase signal is interpolated from a first phase and a second phase of the four-phase signal, the second phase of the six-phase signal is interpolated from the second phase and a third phase of the four-phase signal, the third phase of the six-phase signal is interpolated from the third phase and the second phase of the four-phase signal, the fourth phase of the six-phase signal is interpolated from the third phase and the fourth phase of the four-phase signal, the fifth phase of the six-phase signal is interpolated from the fourth phase and the first phase of the four-phase signal, and the sixth phase of the six-phase signal is interpolated from the first phase and the fourth phase of the four-phase signal.

14. The method of claim 9, wherein a weighted sum is used to embody interpolation.

15. The method of claim 14, wherein each of the six phases of the six-phase signal is generated by a respective weighted sum of a respective pair of phases of the four-phase signal.

* * * * *